(12) United States Patent
Buric et al.

(10) Patent No.: US 11,352,712 B1
(45) Date of Patent: Jun. 7, 2022

(54) METHOD FOR CONTROLLING FIBER GROWTH IN A LASER HEATED PEDESTAL GROWTH SYSTEM BY CONTROLLING A LASER POWER OUTPUT, A PEDESTAL FEEDSTOCK RATE OF MOTION, AND A DRAW RATE

(71) Applicant: Energy, United States Department of, Washington, DC (US)

(72) Inventors: Michael P. Buric, Pittsburgh, PA (US); Bo Liu, Morgantown, WV (US)

(73) Assignee: Energy, United States Department of, Washington, DC (US)

( * ) Notice: Subject to any disclaimer, the term of this patent is extended or adjusted under 35 U.S.C. 154(b) by 63 days.

(21) Appl. No.: 16/368,425

(22) Filed: Mar. 28, 2019

Related U.S. Application Data

(60) Provisional application No. 62/649,919, filed on Mar. 29, 2018.

(51) Int. Cl.
*C30B 15/22* (2006.01)
*C30B 13/30* (2006.01)
(Continued)

(52) U.S. Cl.
CPC .............. *C30B 13/30* (2013.01); *C30B 13/22* (2013.01); *H01S 3/1636* (2013.01); *H01S 3/1643* (2013.01)

(58) Field of Classification Search
CPC .. C30B 9/00; C30B 9/04; C30B 13/00; C30B 13/16; C30B 13/22; C30B 13/24; C30B 13/28; C30B 13/30; C30B 15/00; C30B 15/14; C30B 15/16; C30B 15/20; C30B 15/22; C30B 15/26; C30B 29/00; C30B 29/10; C30B 29/16; C30B 29/20;
(Continued)

(56) References Cited

U.S. PATENT DOCUMENTS 2,783,168 A * 2/1957 Schweickert ........... C30B 11/10
117/22
4,876,438 A * 10/1989 Watanabe ............... C30B 13/30
219/497
(Continued)

OTHER PUBLICATIONS

M. Buric, et al. publication entitled "Laser heated pedestal growth system commissioning and fiber processing," Proc. of SPIE, vol. 9852, pp. 985219-1 to -9 (2016). (Year: 2016).*
(Continued)

*Primary Examiner* — Kenneth A Bratland, Jr.
(74) *Attorney, Agent, or Firm* — Timothy L. Harney; Aaron R. Keith; Michael J. Dobbs

(57) ABSTRACT

One or more embodiments relate to a method for controlling fiber growth and fiber diameter in a laser heated pedestal growth (LHPG) system so as to provide long, continuous single-crystal optical fibers of uniform diameter. The method generally provides three independent parameter feedback controls to control the molten zone height, laser power, and fiber drawing rates simultaneously in order to reduce the mismatch between instantaneous diameter changes and current diameter. The method permits the growth of fibers with non-uniform diameters along the fiber's length. The method also provides the capability to stop the LHPG system, remove the exhausted pedestal feedstock with a second pedestal feedstock, and restart the LHPG system to provide a continuous fiber.

13 Claims, 10 Drawing Sheets

(51) Int. Cl.
    *C30B 13/22* (2006.01)
    *H01S 3/16* (2006.01)
(58) Field of Classification Search
    CPC ......... C30B 29/22; C30B 29/28; C30B 29/62; H01S 3/1636; H01S 3/1643
    USPC .............. 117/11, 13–15, 23, 35, 73–75, 937, 117/944–945, 950
    See application file for complete search history.

(56) References Cited

U.S. PATENT DOCUMENTS

| | | | |
|---|---|---|---|
| 5,607,506 A | | 3/1997 | Phomsakha et al. |
| 5,932,002 A | * | 8/1999 | Izumi ..................... C30B 15/36 117/13 |
| 2001/0043733 A1 | * | 11/2001 | Altekruger ............. G01B 11/08 382/141 |
| 2018/0051389 A1 | * | 2/2018 | Maxwell ............... C03B 37/011 |

OTHER PUBLICATIONS

M. Buric, et al. publication entitled "Laser heated pedestal growth system commissioning and fiber processing," Proc. of SPIE, vol. 9852, p. 985219-1 to -9 (2016). (Year: 2016).*
M.R. B. Andreeta, et al. publication entitled "Automatic diameter control system applied to the laser heated pedestal growth technique," Materials Research, vol. 6, pp. 107-110 (2003). (Year: 2003).*
J. Haggerty, "Production of fibers by a floating zone fiber drawing technique," NASA (1972).
M. Fejer, J. Nightingale, G. Magel et al., "Laser-heated miniature pedestal growth apparatus for single-crystal optical fibers," Review of scientific instruments, 55(11), 1791-1796 (1984).
R. K. Nubling, and J. A. Harrington, "Optical properties of single-crystal sapphire fibers," Appl Opt, 36(24), 5934-40 (1997).
J. A. Harrington, "Single-crystal fiber optics: a review." Proc. of SPIE vol. 8959, 895902 (2014).
M. Buric, M. J. Yip, B. T. Chorpening et al., [Laser heated pedestal growth system commissioning and fiber processing]. Proc. of SPIE vol. 9852, 985219 (2016).
M. Buric, B. Liu, J. Thapa et al., "Single-crystal fiber structures for harsh environment applications (Rising Researcher Presentation)." Proc. SPIE 10654, 10 (2018).
M. Buric, B. Liu, S. Huang et al., "Modified single crystal fibers for distributed sensing applications." Proc. SPIE 10208, 102080C (2017).
B. Liu, M. Buric, J. Wuenschell et al., "Optical properties and long-term stability of unclad single crystal sapphire fiber in harsh environments." Proc. SPIE 10914, 109140Z (2019).
M. R. B. Andreeta, L. C. Caraschi, and A. C. Hernandes, "Automatic diameter control system applied to the laser heated pedestal growth technique," Materials Research, 6, 107-110 (2003).
V. Phomsakha, R. S. F. Chang, and N. Djeu, "Novel implementation of laser heated pedestal growth for the rapid drawing of sapphire fibers," Review of Scientific Instruments, 65(12), 3860 (1994).
G. Maxwell, B. Ponting, E. Gebremichael et al., "Advances in Single-Crystal Fibers and Thin Rods Grown by Laser Heated Pedestal Growth," Crystals, 7(1), 12 (2017).
J. Zhang, Y. Chen, B. Ponting et al., "Highly efficient waveguided laser performance of diode pumped unclad Yb: YAG crystalline fibre," Laser Physics Letters, 13(7), 075101 (2016).
N. Soleimani, B. Ponting, E. Gebremichael et al., "Coilable single crystals fibers of doped-YAG for high power aser applications," Journal of Crystal Growth, 393, 18-22 (2014).
L. D. Iskhakova, V. V. Kashin, S. V. Lavrishchev et al., "Facet appearance on the lateral face of sapphire single-crystal fibers during LHPG growth," Crystals, 6(9), 101 (2016).
D. Zhou, C. Xia, Y. Guyot et al., "Growth and spectroscopic properties of Ti-doped sapphire single-crystal fibers," Optical Materials, 47, 495-500 (2015).
B. T. Laustsen, J. A. Harrington, and R. K. Shori, "Fabrication and optical properties of single-crystal YAG fiber optics," Proc. of SPIE 8235, 823505 (2012).
C.-L. Chang, S.-L. Huang, C.-Y. Lo et al., "Simulation and experiment on laser-heated pedestal growth of chromium doped yttrium aluminum garnet single crystal fiber," Journal of Crystal Growth, 318(1), 674-678 (2011).
K. Huang, K. Hsu, D. Jheng et al., "Low-loss propagation in Cr4+: YAG double-clad crystal fiber fabricated by sapphire tube assisted CDLHPG technique," Optics express, 16(16), 12264-12271 (2008).
D. R. Ardila, J. Andreeta, C. Ribeiro et al., "Improved laser-heated pedestal growth system for crystal growth in medium and high isostatic pressure environment," Review of Scientific Instruments, 70(12), 4606-4608 (1999).

* cited by examiner

Left side

Taper section

Right side

METHOD FOR CONTROLLING FIBER GROWTH IN A LASER HEATED PEDESTAL GROWTH SYSTEM BY CONTROLLING A LASER POWER OUTPUT, A PEDESTAL FEEDSTOCK RATE OF MOTION, AND A DRAW RATE

CROSS REFERENCE TO RELATED APPLICATIONS

This application claims the benefit of U.S. Provisional Application No. 62/649,919 filed on Mar. 29, 2018, the disclosure of which is incorporated herein by reference.

GOVERNMENT INTEREST

The United States Government has rights in this invention pursuant to the employer-employee relationship of the Government to the inventors as U.S. Department of Energy employees and site-support contractors at the National Energy Technology Laboratory.

FIELD OF THE INVENTION

One or more embodiments relate to a method for controlling fiber growth and fiber diameter in a laser heated pedestal growth (LHPG) system so as to provide long, continuous single-crystal optical fibers of uniform diameter. The method generally provides three independent parameter feedback controls to control the molten zone height, laser power, and fiber drawing rates simultaneously in order to reduce the mismatch between instantaneous diameter changes and current diameter. The method permits the growth of fibers with non-uniform diameters along the fiber's length. The method also provides the capability to stop the LHPG system, remove the exhausted pedestal feedstock with a second pedestal feedstock, and restart the LHPG system to provide a continuous fiber.

BACKGROUND OF THE INVENTION

Since the inception of the Laser-Heated Pedestal Growth (LHPG) technique decades ago, single-crystal optical fibers have been produced using various materials for a range of novel applications. The most common single-crystal optical fibers are produced in yttrium aluminum garnet (YAG) for fiber laser applications, and sapphire for sensing or transmission applications. An array of other materials has been shown feasible for growth with LHPG. A number of useful methods have emerged for cladding single-crystal fibers, although most cladding methods suffer from large losses, operating temperature limitations, or expensive application processes. Despite these difficulties single-crystal fibers, and in particular sapphire optical fiber, is still operable at high-temperatures (e.g. 2050° C. melting temperature), is resistant to chemical degradation by species like hydrogen and water, is intrinsically immune to electro-magnetic interference, and is very hard and mechanically robust. These features make sensing with single-crystal fiber an attractive alternative to conventional methods and devices.

A number of sapphire or other single-crystal based sensor devices have been produced. For single-point sensing applications, sapphire-fiber based fluorescence decay-time thermometers are commercially available. Interferometric temperature sensors were successfully fabricated using sapphire fibers with micro-machined resonator cavities and sapphire wafer-reflectors. More recent developments in Type II fiber Bragg gratings have permitted the fabrication of Bragg-grating-based temperature or strain sensors in single-crystal materials. Chemical sensing using sapphire fibers and chemically sensitive over-layers has also been demonstrated. Recently, researchers have also integrated distributed sensing and interrogation concepts with single-crystal fiber platforms. Distributed Raman temperature sensing was successfully demonstrated with sapphire fiber. Rayleigh scattering was also successfully demonstrated using a modified sapphire fiber. These important sensing developments demonstrate the potential for extending modern optical sensing and modern measurement methods into more difficult applications using the single-crystal fiber platform.

While significant developments have emerged in single-crystal fiber sensing techniques, crystal fiber claddings, and interrogation methodologies; a host of issues still exist in the design and optimization of single-crystal fiber sensing schemes. In particular, few have explored the fabrication of in-fiber devices and functional fiber structures for sensing. In silica-fiber systems common to telecommunications and more conventional sensor installations, silica fiber is usually drawn as a monolithic transmission component without significant modification, and functional devices are later added or the fiber is further modified in post-processing to functionalize the fiber for the intended application. Some devices such as intrinsic distributed Rayleigh or Raman scattering sensors do not require modification or functionalization; but these methods can still benefit from systematic enhancements to the fiber or the addition of engineered in-fiber components for increased functionality or sensing capabilities. This paradigm of drawing a silica fiber and later adding devices through post processing or splicing is somewhat cumbersome in any case, but presents particular problems for the single-crystal fiber platform. Therein, large splicing losses can be an issue when integrating any sensor device, and large refractive-index mismatch generally makes integration with standard silica-based devices less advantageous. Fortunately, the slow and controllable LHPG crystal-growth process can be used as a powerful tool for the fabrication of in-fiber devices and components.

In one application, environment sensor are becoming more accessible due to the implementation of single-crystal optical materials and devices. In particular, fossil energy applications like gas turbines or coal gassifiers require new, more robust sensing technologies compatible with modern control schemes. Fabricating common devices in sapphire or YAG fibers rather than standard fused silica can extend the operating temperature range significantly beyond the current state of the art.

However, sapphire and YAG optical fibers are only commercially available in short lengths (<2 m). This is due to both equipment constraints and material-intrinsic constraints. Fibers grown via the laser-heated pedestal growth (LHPG) method are formed from a pedestal of the same material as the finished fiber; either in the single crystal form or the un-ordered oxide form. In either case, the pedestal is a finite-sized piece of feedstock material to be formed into fiber; thus can only produce a fiber of a fixed length for a given diameter. A feedstock pedestal rod with a particular volume will produce a fiber with a corresponding smaller diameter but with a volume similar to the original pedestal rod. For example, a 1 mm diameter, 100 mm long, cylindrical pedestal will produce a 110 um by roughly 8 meter long fiber before the pedestal is used up completely. This intrinsic length limitation arises because any feedstock pedestal material has a finite volume. Therefore, there is a need for a LHGP system capable of stopping and changing the pedestal to achieve an arbitrarily long single-crystal fiber is necessary.

SUMMARY OF THE INVENTION

The disclosure provides a method for controlling fiber growth in a laser heated pedestal growth system. The method comprises: providing a laser having a power output; measuring the power output; controlling the power output; providing a feedstock pedestal having a melt end, where a molten zone is formed by heating the melt end via the laser beam according to the power output, and where the molten zone has a height; measuring the molten zone height at a fixed location relative to the laser beam focus; controlling the molten zone height by: drawing a fiber from the molten zone at a draw rate, where the fiber has a longitudinal length, and where the fiber has a drawing diameter at a solidification point proximal to the molten zone; measuring the drawing diameter, measuring the draw rate; and, controlling the draw rate to provide a desired drawing diameter. The method is distinguished by utilizing simultaneous controls of the laser based on its measured power, control of the pedestal feedstock velocity (feed rate) based on the molten zone location, and control of the fiber draw rate based on its measured diameter.

The method disclosed is particularly useful for controlling the growth of fibers grown in an LHPG system. Such fibers are useful for sensing applications. The method disclosed is further demonstrated and described in the following description.

BRIEF DESCRIPTION OF THE DRAWINGS

These and other features, aspects, and advantages of the multiple embodiments of the present invention will become better understood with reference to the following description, appended claims, and accompanied drawings where:

DETAILED DESCRIPTION OF THE DISCLOSURE

Figure 1:
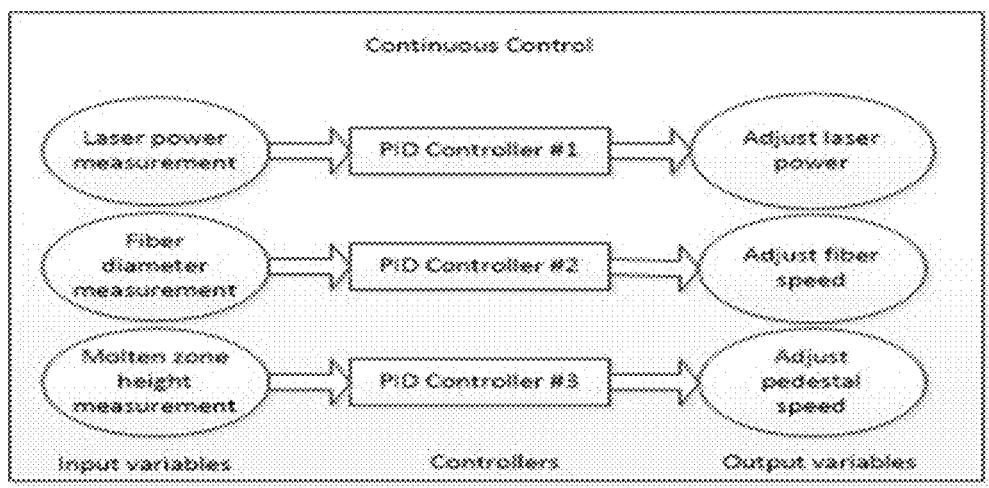
FIG. 1 provides a schematic of the method using three PID controllers simultaneously in an LHPG system.

The following description is provided to enable any person skilled in the art to use the invention and sets forth the best mode contemplated by the inventor for carrying out the invention. Various modifications, however, will remain readily apparent to those skilled in the art, since the principles of the present invention are defined herein specifically to provide description of a method for the control of a Laser-Heated Pedestal Growth system for manufacturing single-crystal fibers.

Laser heated pedestal growth can be used as a well-controlled platform for the production of in-fiber devices as well as the more conventional growth of uniform fiber for the transmission and delivery of sensing light. Historically, researchers have sought to stabilize their LHPG systems such that the production of fibers with continuous single-crystals with uniform orientation, minimum crystal defects, and highly accurate fiber diameter is possible. It is understood that such a system, when properly controlled, can also be used for the growth of non-uniform fiber whose diameter varies by design. In an exemplary LHPG system, a DC powered $CO_2$ laser is used as the source for laser heating. The beam is combined with a red guide-beam for alignment. A portion of the beam is also directed into a thermopile power meter to aid in the stabilization of the laser's output power. The beam is then expanded in a beam telescope, and is transformed into a collimated "doughnut" beam via a reflaxicon and a collimating component. The collimated "doughnut" beam is then focused onto the pedestal-feedstock having a melt end, which the beam heats to form a molten zone from which a fiber is drawn. The resulting laser spot is symmetric and highly stable. As the material at the molten zone is depleted through the drawing of the fiber, a proportional amount of material is added into the molten zone by advancing the pedestal feedstock at a feed rate into the focus of the beam. The advancement of the pedestal feedstock provides a relatively constant supply of material into the molten zone from which to draw the fiber.

Mechanically, LHPG systems rely on multiple sets of drive rollers to advance the pedestal feedstock and pull the growing crystal upwards. A guide-tube surrounds the growing fiber and helps to keep it stable in the molten zone. The drive rollers are directly coupled to brushless-slotless DC motors with quadrature sine-wave encoders for accurate velocity and position control. Together, this system of components is capable of producing highly uniform sapphire optical fiber over a wide range of useful diameters and a wide range of reduction ratios.

To grow highly uniform fiber, various parameters must be carefully controlled. In general, a careful accounting must be made of the energy and mass constantly passing through the molten zone. This implies that the laser power (energy input) must be controlled, along with the rate of mass-intake (the pedestal feedstock velocity) and the rate of mass-uptake (the draw rate). When those three parameters are well-controlled, fiber of continuous diameter can be produced. The present disclosure provides for this control as illustrated in FIG. 1.

Figure 2:
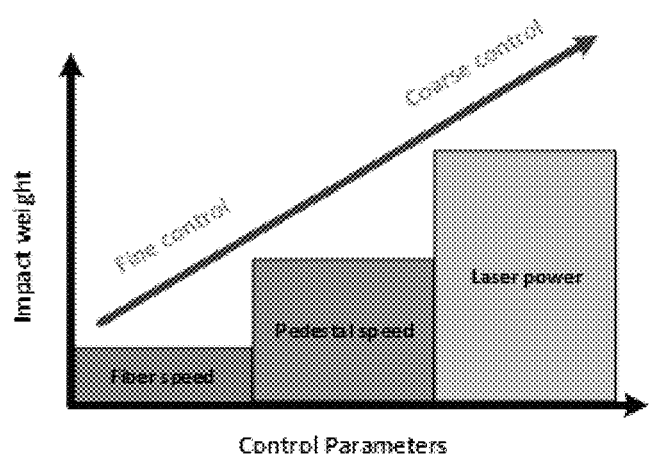
FIG. 2 depicts graphically relative magnitudes and response times of LHPG control parameters.

FIG. 2 compares the magnitude of the response on the grown-fiber diameter for an input on each of those three parameters. Because the laser is used as the sole source of heat in the system, and viscosity in the molten zone is dependent on the heat input, changes in the laser power result in the largest and most immediate changes in fiber diameter. Some of the earliest LHPG control schemes used variation in the laser power to control fiber diameters while pedestal and fiber velocities remained constant. This was not the most ideal control scheme, because of the intrinsic nature of $CO_2$ lasers. Varying the power often resulted in temperature instabilities in the laser cavity, which in turn made the laser more difficult to stabilize about a constant operating point.

A 3:1 fiber drawing ratio provides in the highest possible rate of fiber growth, as well as high growth stability. However, when the pedestal is 3 times larger than the grown-fiber diameter, changes in the velocity of the pedestal have roughly 9 times larger an effect on the diameter as do changes in the velocity of the fiber. Any growth which reduces the diameter of the feedstock (as is the case in LHPG), the velocity of the feedstock will have a greater effect on the diameter of the grown-fiber than the velocity of the fiber itself.

To improve LHPD systems, the present disclosure provides a method to control for the growth of high quality LHPG-produced fibers. The method provides the capability to grow fibers of varying diameter and to grow continuous fibers through the replenishment of the pedestal feedstock.

Laser Control:

First, laser power is controlled to be stabilized. Accordingly, the laser power has a power output. That power output provides heat to the melt end of the pedestal feedstock to form the molten zone. Measuring the laser power output provides a value to determine heat input into the system at the pedestal feedstock, thus providing a power output feedback input based on the power measurement to feed a control so as to ensure constant or well-stabilized heat-flux into the molten zone. In effect, a first control loop is established. Preferentially, a portion of the beam is directed into a power meter such as a thermopile power meter. Data from the power meter provides an input for a first proportional, integral, derivative algorithmic (PID) controller. The first PID controller controls the power output to stabilize the heat input to the LHPG system. Power output control may be accomplished by adjusting the input energy of the laser or optically. Preferentially, the first PM-controlled laser power output is stabilized within 1% power stability. The effect is that diameter fluctuations in the fiber are minimized while the laser is stable.

Molten Zone Height Control:

Rather than control for the second parameter above, pedestal feedstock velocity, the molten zone height is measured and controlled. The upper extent of the molten zone is measured by the cameras through the intensity and color of the molten zone, which is at a fixed location relative to the laser beam focus. Then, the second PID controller varies the upward movement rate of the pedestal feedstock in order to maintain the height of the molten zone at one fixed location with respect to the laser focus and camera field of view. Thus, the molten zone height establishes a molten zone height feedback input to control the pedestal feedstock rate of motion (advancement speed). In effect, a second control loop is established.

Figure 3:
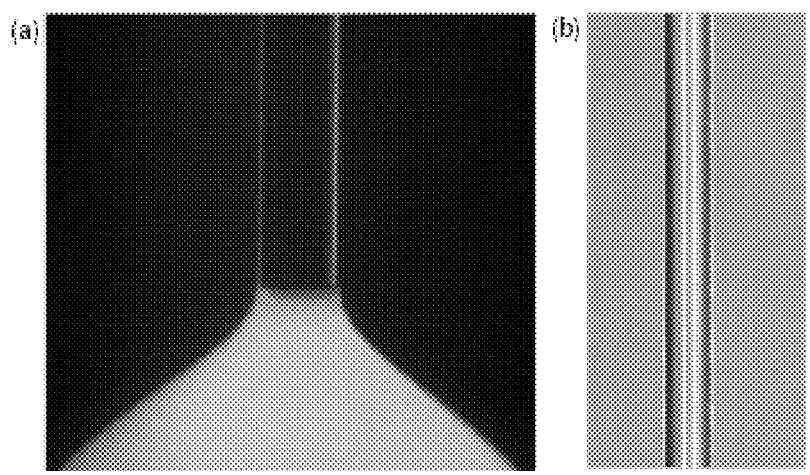
FIG. 3 illustrates a single crystal sapphire fiber fabricated according to the method where 3A illustrates monitoring of sapphire fiber and the melting pool during drawing process; where 3B illustrates a microscope image of sapphire fiber.

A camera array is used to observe and measure the molten zone height during crystal growth. Preferentially, the camera array is a dual-camera system. These cameras capture images of the molten zone at about 90-degrees from each other while oriented axially to the fiber and provide a full picture of the location of the fiber with respect to the molten zone as shown in FIG. 3A. The camera array facilitates using a set of actuators that control the X and Y position of the fiber such that the fiber remains centered in the molten zone over long growth periods, even in the presence of a slightly tilted pedestal axial orientation. Images are collected at 12.5 frames per second (or a similarly high rate of acquisition), and each set of images is processed in real-time to measure the fiber's diameter.

The camera array-based measurement system provides for the observation of the shape, size, and orientation of the molten-zone in real-time. Molten zone height data from the camera array provides an input for a second PID controller. The second PID controller then controls pedestal feedstock velocity (material feed rate) to maintain the molten zone height. Preferentially, molten zone height is maintained at a fixed height.

In effect, because the pedestal feedstock upward velocity provides mass-input to the system, variation in that velocity also changes the vertical position of the top of the molten zone. By measuring the molten zone height via the camera array, it is possible to control the pedestal feedstock's upward velocity to stabilize the position of the top of the molten zone.

Fiber Draw Rate Control:

Fine control of the produced fiber-diameter is possible by controlling fiber draw rate, i.e. the upward rate of fiber drawn from the molten zone. Controlling molten zone height also provides for stabilizing the solidification point of the material drawn from the molten zone. By stabilizing the solidification point, the fiber diameter may be accurately measured by the camera array at a point proximal to (directly above), the solidification point as shown in FIG. 3B. Then, the intensity and color of the grown fiber image is used to measure the diameter which establishes a draw rate feedback input. In effect, a third control loop is established.

The camera array observing the molten zone is the same camera array observing the fiber diameter. The fiber diameter data from the camera array provides input for a third PID controller. As noted above, drive rollers provide a route for measuring the actual draw rate. The draw rate is then controlled by the third PID by advancing or retarding the draw rate to provide fine control of the fiber diameter, such that that diameter variations due to imperfect pedestal dimensions are reduced. Thus, the method to control the fiber growth in the LHPG system allows a fiber to be drawn, where the fiber drawn has a desired drawing diameter.

Using these 3 PID control loops permits the instantaneous growth of any desired fiber diameter. The method described here permits the growth of single-crystal optical fibers with less total variation in desired outer diameter as compared to other methods. It also permits large diameter reductions to be performed in a single step as opposed to multiple steps required by prior methods. While PID control is preferred, other control logic could also be implemented to the same effect. Other control logic control techniques include fuzzy logic and adaptive controllers. Therefore, a non-PID control that relies on the same input and output variables may be used. The PID or other controller constants are selected to minimize variations in desired fiber diameter. The distinguishing factors are the control of the laser based on its measured power, control of the pedestal feedstock velocity (feed rate) based on the molten zone location, and control of the fiber draw rate based on its measured diameter.

The disclosed method provides key improvements in LHPG operations. Because the top of the molten zone is well-controlled and always maintained in the same location, the system is capable of immediately drawing a desired diameter at the beginning of the fiber-growth. Fibers are drawn immediately with no observable change in diameter and no significant period of time required to arrive at the chosen diameter; provided the seed-fiber utilized is of similar size to the intended grown-diameter. This means that a fiber of a certain desired size can be grown; fully exhausting one pedestal. The LHPG system may be stopped by shutting off the laser, the exhausted pedestal can be replaced with a second pedestal feedstock, and the system can be re-started using the new pedestal, without any observable change in fiber diameter from the previous fiber section to the new fiber section. Thus, the disclosed method provides a "start and stop" feature which produces fibers of continuous, constant desired diameter and length without the need for post-splicing or joining.

As the method provides fine fiber diameter monitoring and control, the fiber growth may also be reversed. When the fiber diameter grown deviates from acceptable parameters or has other discontinuities, the direction of motion for the fiber, the pedestal, or both the fiber and pedestal may be reversed. Such reversing is possible as the LHPG system provided is bidirectional. In effect, the reversal provides insertion of the fiber back into the molten zone, re-melting of the fiber section, which then allows for re-growing that section of the fiber.

Figure 4:
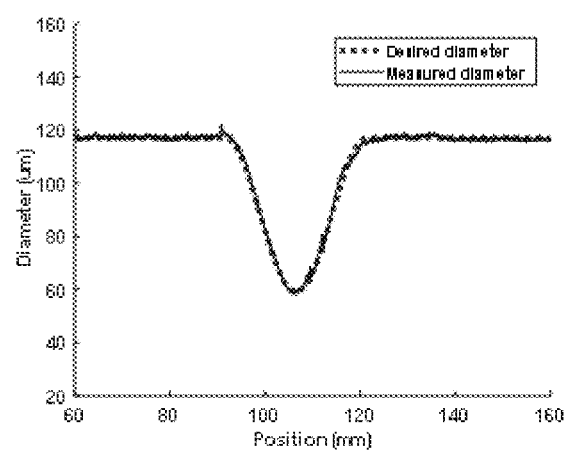
FIG. 4 illustrates a sapphire fiber double taper profile desired (solid) and measured (dotted) diameter.

Additionally, the disclosed method provides the growth of in-fiber devices that require quicker variations in diameter along the length of the fiber. FIG. 4 shows an example of sapphire fiber during operating process and the microscope image of a typical section. The method allows the user to specify a diameter profile along the length of the fiber to be grown. Thus, fibers of varying diameter along their longitudinal length may be produced to a provide fibers of a specified diameter profile (tapers, double tapers, etc) along their length.

The desired diameter profile consists of a list of desired diameter and length points. A first set of rules (or constants) is obtained and applied to a first set of established parameters to adjust a laser power output to maintain the laser power output with less than 1% varying stability; a second set of rules (or constants) is obtained and applied to a second set of established parameters indicative of molten zone height to adjust the pedestal feedstock velocity to maintain a constant molten zone height; and a third set of rules (or constants) is obtained and applied to a third set of established parameters indicative of drawn diameter to adjust the draw rate to grow a fiber of a desired diameter.

During operation, the LHPG system monitors the length of the grown fiber by keeping track of the fiber drive motor position. When the grown length approaches the next largest length coordinate in the input file, the appropriate controller replaces the existing desired diameter input with the next corresponding desired diametric size indicated in the file. Using various pre-made input files (parameters), fibers in varying diameter profile may be made.

EXAMPLES

Figure 5:
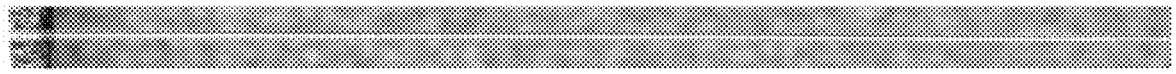
FIG. 5 illustrates microscope images of the sapphire fiber diametric variations.
Figure 5:
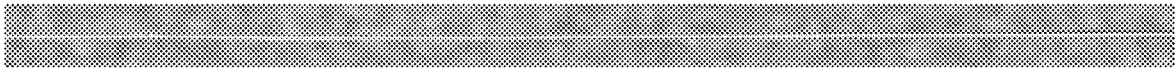
Figure 5:
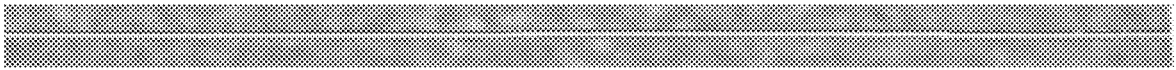

The growth capabilities of an LHPG system utilizing the disclosed method were evaluated using various input diameter profiles over a range of modulation amplitudes and frequencies. FIG. 4 depicts diameter data of a simple double-taper feature that was grown in single-crystal sapphire. In FIG. 4, the desired grown diameter is plotted along with the diameter measured during growth. The length of the taper is 3 cm. The grown diameter is similar to the desired profile, and exhibits a maximum deviation from the desired profile of about 2 microns over the most part of the taper, which varies from 117 µm down to 59 µm. Microscope images of the structure are also provided in FIG. 5.

Figure 6:
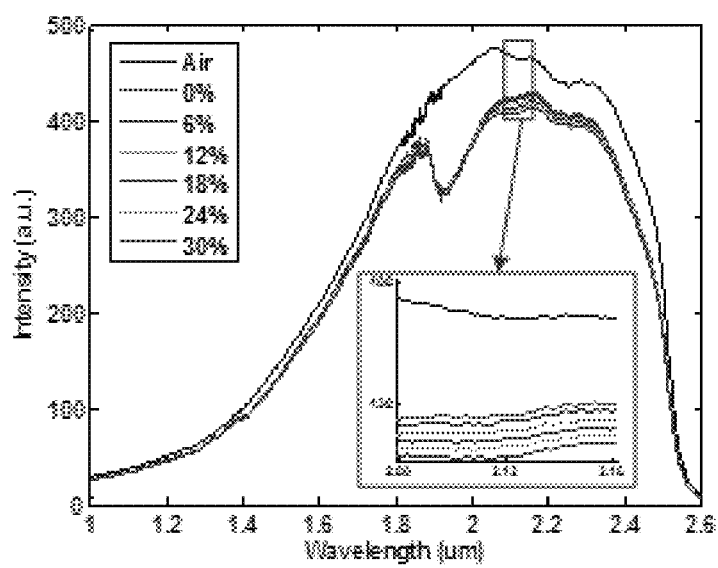
FIG. 6 illustrates fiber double-taper transmission in air, and in glucose solution from 0% to 30%.
Figure 7:
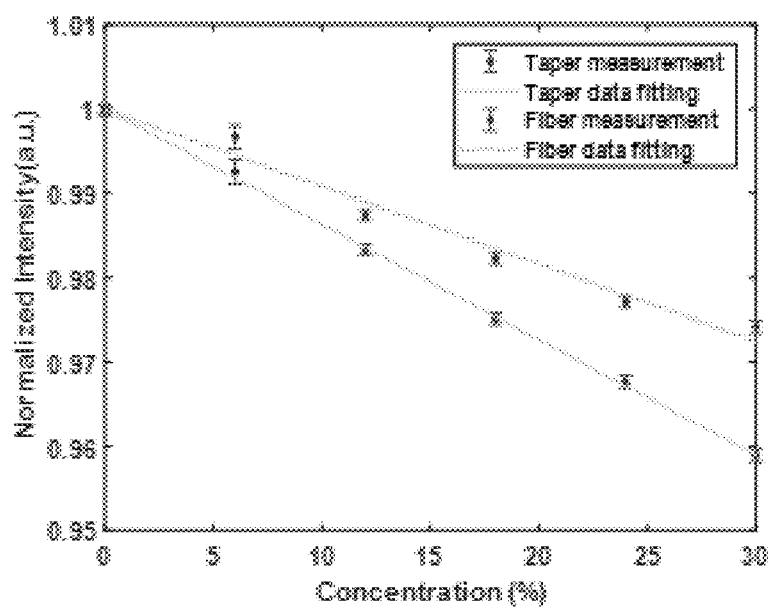
FIG. 7 illustrates fiber double-taper normalized transmitted intensity at 2.115 µm at the double taper sections (solid cyan) and straight fiber section (dash green) in glucose solution.

A simple evanescent wave absorption sensing experiment was conducted using the double-taper structure in unclad sapphire. First, the end faces of the fiber were polished and connectorized. A halogen slight source was coupled to one end of the sensor-fiber, and the other end was terminated in a miniature spectrometer. The fiber was kept straight during the experiment to minimize bending effects. A small liquid cell was implemented to introduce various solutions for sensing. The cell could be moved along the length of the fiber such that straight sections or the double taper could be evaluated. Glucose solutions were prepared in varying concentrations to evaluate the sensing response. FIG. 6 shows the resultant transmission spectrum in air, in pure water, and in varying concentrations of glucose. The strong absorption dip near 1.9 µm is due to water absorption in the solution. The surrounding absorption peaks are the result of the IR absorption intrinsic to glucose in solution. FIG. 7 plots the normalized transmitted intensity at 2.115 µm, which appears to follow standard Beer-Lambert absorption, but with increased sensitivity as compared to free-space absorption. The inset of the figure also plots the transmitted intensity at 2.115 µm when the liquid cell is positioned over a straight section of sapphire fiber. As expected, the slope of the absorption plot is about 49% steeper in the double-taper section versus the straight section, indicating that the double-taper structure is effective at transferring power into the surrounding media.

Figure 8:
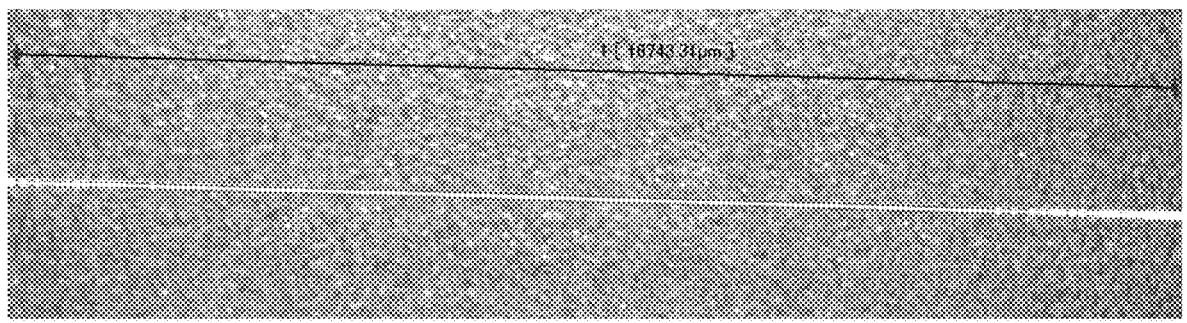
FIG. 8 illustrates sinusoidal sapphire fiber: desired (solid) and measured (dotted) diameter, and microscope images of the diametric variations.

After evaluating the fiber double taper, a sinusoidal varying fiber was fabricated. Because this structure requires more quickly varying diameters, it was significantly more difficult to produce than the double taper structure. To accomplish the largest variations, additional "coarse" diameter control capabilities were accessed via feedback to the pedestal velocity. As was mentioned, for constant diameter fiber, the molten zone height is maintained by control of the pedestal velocity. In this case, pedestal velocity feedback was introduced to permit large instantaneous increases or decreases in fiber diameter. While this has the effect of allowing larger diameter changes to be grown, it also makes it somewhat more difficult to grow a constant diameter, which results in larger errors for constant diameter sections of the same fiber. This problem was overcome by disabling the increased variation capabilities during the straight lead-in and lead-out sections of the fiber. FIG. 8. shows the desired and measured fiber diameter, along with microscope images of the varying portion of the fiber. A total of 6 periods were grown, with maximum diameter of 117 µm, minimum diameter of 97 µm, and a period of 5 mm.

Figure 9:
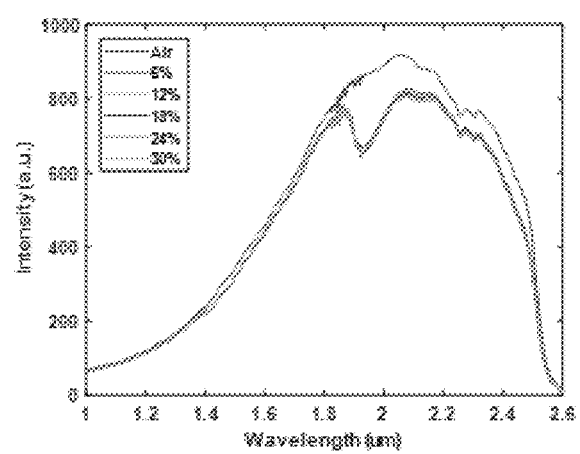
FIG. 9 illustrates transmitted intensity at 2.115 µm with varying glucose concentration in the sinusoidal varying portion.
Figure 10:
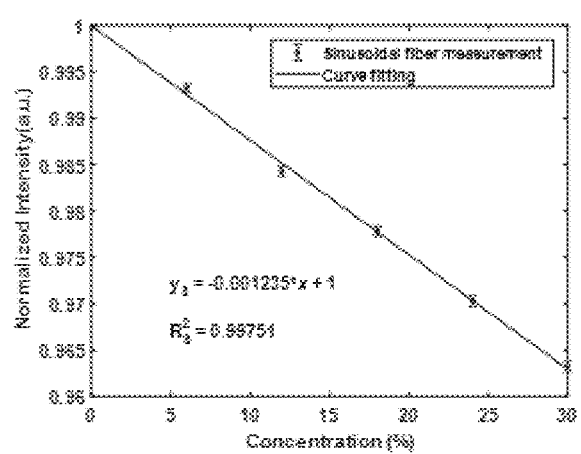
FIG. 10 illustrates normalized transmitted intensity at 2.115 µm with varying glucose concentration in the sinusoidal varying portion.

To evaluate the grown sinusoidal sapphire fiber, the same simple evanescent wave absorption sensing experiment was conducted. The sinusoidal sections of the fiber were exposed to the same glucose solutions used in the double taper experiments. FIGS. 9 & 10 show the transmitted spectrum and their intensities at 2.115 µm for the sinusoidal sections of fiber. It is noted that the slopes of the sinusoidal section is 34% larger than that of the straight section, again indicating the effectiveness of the fiber structure at transferring power outside the core where it can perform useful sensing. The sinusoidal structure has similar sensitivity with the double-taper structure but with better robustness and less susceptible to fiber bending due to the large waist diameter.

Through careful evaluation of LHPG system control parameters, a significantly improved LHPG operating method was developed. The method is particularly applicable to YAG and sapphire fibers. The provided method is capable of reducing diametric variations in a constant-diameter fiber, or also of producing large controlled variations in changing-diameter fiber. Using the method along with a desired fiber diameter profile, virtually any axial structure within the maximum and minimum growth capabilities of the system may be formed. Since long-period gratings have been fabricated in silica using $CO_2$ laser-induced micro-tapers or diameter variations, the same approach using single-crystal sapphire optical fiber were grown with linearly and sinusoidally varying diameters. These initial attempts at single-crystal fiber diameter variation show that the technique is both feasible and effective at producing useful in-fiber devices.

While these examples were carried out in un-clad single-crystal sapphire, the resultant structures can be easily clad using sol-gel, hydrothermal, diffusion, or implantation methods. Various cladding methodologies to evaluate the effects of cladding thickness and materials on the evanescent wave sensing application are contemplated for applications such as high-temperature chemical sensing. This may permit the sensing of water in the steam phase in high-temperature combustion systems, or similar high-value measurements. While these types of intensity-modulating sensors are quite useful, the technique will take on even further utility if future researchers are capable of reasonably producing single-mode sapphire fibers.

Having described the basic concept of the embodiments, it will be apparent to those skilled in the art that the foregoing detailed disclosure is intended to be presented by way of example. Accordingly, these terms should be interpreted as indicating that insubstantial or inconsequential modifications or alterations and various improvements of the subject matter described and claimed are considered to be within the scope of the spirited embodiments as recited in the appended claims. Additionally, the recited order of the elements or sequences, or the use of numbers, letters or other designations therefor, is not intended to limit the claimed processes to any order except as may be specified. All ranges disclosed herein also encompass any and all possible sub-ranges and combinations of sub-ranges thereof. Any listed range is easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as up to, at least, greater than, less than, and the like refer to ranges which are subsequently broken down into sub-ranges as discussed above. As utilized herein, the terms "about," "substantially," and other similar terms are intended to have a broad meaning in conjunction with the common and accepted usage by those having ordinary skill in the art to which the subject matter of this disclosure pertains. As utilized herein, the term "approximately equal to" shall carry the meaning of being within 15, 10, 5, 4, 3, 2, or 1 percent of the subject measurement, item, unit, or concentration, with preference given to the percent variance. It should be understood by those of skill in the art who review this disclosure that these terms are intended to allow a description of certain features described and claimed without restricting the scope of these features to the exact numerical ranges provided. Accordingly, the embodiments are limited only by the following claims and equivalents thereto. All publications and patent documents cited in this application are incorporated by reference in their entirety for all purposes to the same extent as if each individual publication or patent document were so individually denoted.

We claim:

1. A method for controlling fiber growth in a laser heated pedestal growth system, the method comprising:

providing a laser having a power output;

measuring the power output to establish power output feedback data;

controlling the power output using a first proportional, integral, derivative algorithmic controller which uses the power output feedback data as input to the first proportional, integral, derivative algorithmic controller;

providing a pedestal feedstock having a melt end, where a molten zone is formed by heating the melt end via the laser beam according to the power output, and where the molten zone has a height;

measuring the molten zone height at a fixed location relative to a focus of the laser beam to establish-molten zone height feedback data;

controlling the molten zone height to control a pedestal feedstock rate of motion using a second proportional, integral, derivative algorithmic controller separate from the first proportional, integral, derivative algorithmic controller, the second proportional, integral, derivative algorithmic controller using the molten zone feedback data as input;

drawing a fiber from the molten zone at a draw rate, where the fiber has a longitudinal length, and where the fiber has a drawing diameter;

measuring the drawing diameter at a point proximal to the molten zone to establish a draw rate feedback data, controlling the draw rate to provide a desired drawing diameter using a third proportional, integral, derivative algorithmic controller separate from the first and second proportional, integral, derivative algorithmic controllers, using the draw rate feedback data as input to the third proportional, integral, derivative algorithmic controller.

2. The method of claim 1 where the fiber is a sapphire fiber.

3. The method of claim 1 where the fiber is a yttrium aluminum garnet fiber.

4. The method of claim 1 where the desired drawing diameter comprises a varying desired drawing diameter.

5. The method of claim 1 where the molten zone height comprises a constant molten zone height.

6. The method of claim 1 where measuring the molten zone height is performed using a camera array.

7. The method of claim 1 where measuring the drawing diameter is performed using a camera array.

8. The method of claim 1 where measuring the molten zone height and drawing diameter is performed using a camera array.

9. The method of claim 8 where the camera array has two telecentric lens cameras arranged 90° to one another axially to the fiber.

10. The method of claim 1 further comprising stopping the laser heated pedestal growth system; replacing the feedstock pedestal; and restarting the laser heated pedestal growth system.

11. The method of claim 10, where the fiber is a continuous fiber.

12. The method of claim 1 further comprising reversing the direction the fiber is drawn back to the molten zone, and redrawing a portion of the fiber.

13. A method for controlling fiber growth and fiber diameter in a laser heated pedestal growth system, the method comprising:

obtaining a first set of rules for adjusting power of a laser source;

obtaining a second set of rules for adjusting a grown fiber growth speed, the second set of rules being different from the first set of rules;

obtaining a third set of rules for measuring a diameter of the grown fiber, the third set of rules being different from the first and second set of rules;

generating a first set of parameters indicative of input power of the laser source and adjusting the input power of the laser source using the first set of rules and the first set of parameters thereby permitting operation of the laser at any input power level to provide a desired power output;

generating a second set of parameters indicative of a molten zone height and using the second set of rules and the second set of parameters independent of the first set of parameters and the first set of rules and adjusting the pedestal feedstock velocity to control the pedestal feedstock rate of motion-using the second set of parameters to maintain a constant molten zone height; and generating a third set of parameters indicative of the diameter of the grown fiber and using the third set of rules and the third set of parameters independent of the first and second set of parameters and the first and second set of rules to control a draw rate of the grown fiber using the third set of parameters.

\* \* \* \* \*